(12) United States Patent
Jiang et al.

(10) Patent No.: US 10,660,200 B2
(45) Date of Patent: May 19, 2020

(54) ARCHIMEDEAN SPIRAL DESIGN FOR DEFORMABLE ELECTRONICS

(71) Applicant: ARIZONA BOARD OF REGENTS ON BEHALF OF ARIZONA STATE UNIVERSITY, Scottsdale, AZ (US)

(72) Inventors: Hanqing Jiang, Chandler, AZ (US); Cheng Lv, Tempe, AZ (US); Hongyu Yu, Chandler, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 11 days.

(21) Appl. No.: 15/625,924

(22) Filed: Jun. 16, 2017

(65) Prior Publication Data

US 2017/0290151 A1    Oct. 5, 2017

Related U.S. Application Data

(63) Continuation of application No. PCT/US2015/068038, filed on Dec. 30, 2015.
(Continued)

(51) Int. Cl.
| | |
|---|---|
| *H01L 23/538* | (2006.01) |
| *H01L 23/498* | (2006.01) |
| *H05K 1/11* | (2006.01) |
| *H05K 1/02* | (2006.01) |
| *H01M 2/20* | (2006.01) |

(Continued)

(52) U.S. Cl.
CPC .......... *H05K 1/11* (2013.01); *H01L 23/49866* (2013.01); *H01L 23/5387* (2013.01); *H01M 2/202* (2013.01); *H05K 1/0283* (2013.01); *H05K 1/09* (2013.01); *H05K 1/14* (2013.01); *H01L 23/145* (2013.01); *H05K 2201/0314* (2013.01); *H05K 2201/0394* (2013.01); *H05K 2201/09263* (2013.01); *H05K 2201/09945* (2013.01); *H05K 2201/10037* (2013.01)

(58) Field of Classification Search
None
See application file for complete search history.

(56) References Cited

U.S. PATENT DOCUMENTS

| | | |
|---|---|---|
| 4,922,059 A | 5/1990 | Walker et al. |
| 5,008,496 A | 4/1991 | Schmidt et al. |
| | (Continued) | |

FOREIGN PATENT DOCUMENTS

| | | |
|---|---|---|
| CN | 1610168 | 4/2005 |
| KR | 20100131593 A | 12/2010 |
| | (Continued) | |

OTHER PUBLICATIONS

Hu, L.; Cui, H. Energy Environ. Sci. 2012, 6423-6435.
(Continued)

*Primary Examiner* — Wojciech Haske
(74) *Attorney, Agent, or Firm* — Michael Best & Friedrich LLP

(57) ABSTRACT

The invention provides an electronic device that includes a first functional body, a second functional body, and at least one connection member connecting the first functional body to the second functional body. The at least one connection member has a spiral pattern, and is suspended in air to allow for stretching, flexing or compressing.

20 Claims, 8 Drawing Sheets

Related U.S. Application Data

(60) Provisional application No. 62/099,324, filed on Jan. 2, 2015.

(51) Int. Cl.
  *H05K 1/09* (2006.01)
  *H05K 1/14* (2006.01)
  *H01L 23/14* (2006.01)

(56) References Cited

U.S. PATENT DOCUMENTS

| | | |
|---|---|---|
| 5,115,344 A | 5/1992 | Jaskie |
| 5,121,297 A | 6/1992 | Haas |
| 5,168,384 A | 12/1992 | Genba |
| 5,519,596 A | 5/1996 | Woolverton |
| 5,648,771 A | 7/1997 | Halgren et al. |
| 5,903,440 A | 5/1999 | Blazier et al. |
| 5,969,783 A | 10/1999 | Takiar et al. |
| 6,050,962 A | 4/2000 | Kramer et al. |
| 6,299,337 B1 | 10/2001 | Bachl et al. |
| 6,384,890 B1 | 5/2002 | Takiar et al. |
| 6,455,931 B1 | 9/2002 | Hamilton, Jr. et al. |
| 6,461,762 B1 | 10/2002 | Yang et al. |
| 6,476,733 B1 | 11/2002 | Amiri |
| 6,482,540 B1 | 11/2002 | Gozdz et al. |
| 6,584,857 B1 | 7/2003 | Furlani et al. |
| 6,695,457 B2 | 2/2004 | van Drieenhuizen et al. |
| 6,880,955 B2 | 4/2005 | Lin |
| 6,936,855 B1 | 8/2005 | Harrah |
| 7,201,511 B2 | 4/2007 | Moriyama et al. |
| 7,215,547 B2 | 5/2007 | Chang et al. |
| 7,265,719 B1 | 9/2007 | Moosbrugger et al. |
| 7,513,664 B2 | 4/2009 | Chou |
| 8,080,736 B2 | 12/2011 | DeNatale et al. |
| 8,658,904 B2 | 2/2014 | Naganuma et al. |
| 8,685,201 B2 | 4/2014 | O'Rourke et al. |
| 9,706,646 B2 | 7/2017 | Jiang et al. |
| 10,153,519 B2 | 12/2018 | Jiang et al. |
| 10,418,664 B2 | 9/2019 | Jiang et al. |
| 10,502,991 B2 | 12/2019 | Yu et al. |
| 2002/0094701 A1 | 7/2002 | Biegelsen et al. |
| 2003/0070833 A1* | 4/2003 | Barth ............ G02B 6/125 174/250 |
| 2003/0091896 A1 | 5/2003 | Watanabe et al. |
| 2003/0122476 A1 | 7/2003 | Wang et al. |
| 2003/0129488 A1 | 7/2003 | Gross |
| 2004/0118595 A1 | 6/2004 | Flammer et al. |
| 2004/0119442 A1 | 6/2004 | Lee et al. |
| 2004/0172820 A1 | 9/2004 | Lopez |
| 2005/0099361 A1 | 5/2005 | Majer |
| 2005/0110702 A1 | 5/2005 | Aoki et al. |
| 2005/0280157 A1 | 12/2005 | Roush et al. |
| 2006/0063351 A1 | 3/2006 | Jain |
| 2006/0073383 A1 | 4/2006 | Han et al. |
| 2006/0082298 A1 | 4/2006 | Becken et al. |
| 2006/0113279 A1 | 6/2006 | Little |
| 2007/0090457 A1 | 4/2007 | Lee et al. |
| 2007/0166845 A1 | 7/2007 | Yokokawa |
| 2007/0270315 A1 | 11/2007 | Saruwatari et al. |
| 2008/0093110 A1 | 4/2008 | Bagung |
| 2008/0093118 A1 | 4/2008 | Takahashi et al. |
| 2008/0101070 A1 | 5/2008 | Chou |
| 2008/0125510 A1 | 5/2008 | Crosby et al. |
| 2008/0158498 A1 | 7/2008 | Chang et al. |
| 2008/0179079 A1 | 7/2008 | Ishii et al. |
| 2008/0289859 A1 | 11/2008 | Mikado et al. |
| 2009/0009046 A1 | 1/2009 | Oh et al. |
| 2009/0103295 A1 | 4/2009 | Wang |
| 2009/0167171 A1 | 7/2009 | Jung et al. |
| 2009/0207560 A1 | 8/2009 | Lee |
| 2009/0283891 A1 | 11/2009 | Dekker et al. |
| 2009/0297776 A1 | 12/2009 | Crosby et al. |
| 2009/0310209 A1 | 12/2009 | Aschwanden et al. |
| 2009/0310221 A1 | 12/2009 | Aschwanden |
| 2009/0317639 A1 | 12/2009 | Axisa et al. |
| 2010/0011529 A1 | 1/2010 | Won et al. |
| 2010/0053207 A1 | 3/2010 | Cohen et al. |
| 2010/0116526 A1 | 5/2010 | Arora et al. |
| 2010/0143677 A1 | 6/2010 | Lee et al. |
| 2010/0149640 A1 | 6/2010 | Paek et al. |
| 2010/0298895 A1 | 11/2010 | Ghaffari et al. |
| 2010/0307705 A1 | 12/2010 | Rahm et al. |
| 2011/0096545 A1 | 4/2011 | Chang |
| 2011/0227822 A1 | 9/2011 | Shai |
| 2011/0228536 A1 | 9/2011 | Im et al. |
| 2012/0143525 A1 | 6/2012 | Chen et al. |
| 2012/0146050 A1 | 6/2012 | Adam et al. |
| 2012/0168009 A1 | 7/2012 | Chen et al. |
| 2012/0170244 A1 | 7/2012 | Kwon et al. |
| 2012/0202101 A1 | 8/2012 | Jeda |
| 2012/0212820 A1 | 8/2012 | Jiang et al. |
| 2012/0292504 A1 | 11/2012 | Nojima |
| 2013/0115512 A1 | 5/2013 | Jiang et al. |
| 2013/0171490 A1 | 7/2013 | Rothkopf et al. |
| 2013/0290647 A1 | 10/2013 | Maeda et al. |
| 2014/0204300 A1 | 7/2014 | Park et al. |
| 2014/0220422 A1* | 8/2014 | Rogers ............ H01L 23/18 429/163 |
| 2015/0342050 A1 | 11/2015 | Jiang et al. |
| 2016/0050750 A1 | 2/2016 | Rogers et al. |
| 2016/0313478 A1 | 10/2016 | Lee et al. |
| 2017/0338453 A1 | 11/2017 | Yu et al. |

FOREIGN PATENT DOCUMENTS

| | | |
|---|---|---|
| TW | I488750 B | 6/2015 |
| WO | WO 2001094253 | 12/2001 |
| WO | WO 03-021679 | 3/2003 |
| WO | 2009126544 A1 | 10/2009 |
| WO | 2011113038 A2 | 9/2011 |
| WO | WO 2014029908 | 2/2014 |
| WO | WO 2014113489 | 7/2014 |
| WO | 2015100414 A1 | 7/2015 |
| WO | 2016049444 A1 | 3/2016 |
| WO | 2016073584 A1 | 5/2016 |
| WO | 2018212871 A2 | 11/2018 |
| WO | 2019152643 A1 | 8/2019 |

OTHER PUBLICATIONS

Huang, J.; Zhu, H.; Chen, Y.; Preston, C.; Rohrbach, K.; Cumings, J.; Hu, L. ACS Nano 2013, 2106-2113.
Dragoman, M.; Flahaut, E.; Dragoman, D.; Al Ahmad, M.; Plana, R. Nanotechnology 2009, 375203.
Liu, H.; Crooks, R. M. Anal. Chem. 2012, 2528-2532.
Lankelma, J.; Nie, Z.; Carrilho, E.; Whitesides, G. M. Anal. Chem. 2012, 4147-4152.
Liu, H.; Crooks, R. M. J. Am. Chem. Soc. 2011, 17564-17566.
Dungchai, W.; Chailapakul, O.; Henry, C. S. Anal. Chem. 2009, 5821-5826.
Martinez, A. W.; Phillips, S. T.; Whitesides, G. M.; Carrilho, E. Anal. Chem. 2010, 3-10.
Siegel, A. C.; Phillips, S. T.; Wiley, B. J.; Whitesides, G. M. Lab Chip 2009, 2775-2781.
Hu, L.; Zheng, G.; Yao, J.; Liu, N.; Weil, B.; Eskilsson, M.; Kambulut, E.; Ruan, Z.; Fan, S.; Bloking, J. T.; McGehee, M. D.; Wagberg, L.; Cui, Y. Energy Environ. Sci. 2013, 513-518.
Russo, A.; Ahn, B. Y.; Adams, J. J.; Duoss, E. B.; Bernhard, J. T.; Lewis, J. A. Adv. Mater. 2011, 3426-3430.
Yuan, L.; Yao, B.; Hu, B.; Huo, K.; Chen, W.; Zhou, J. Energy Environ. Sci. 2013, 470-476.
Olsson, H.; Carlsson, D. O.; Nystrom, G.; Sjodin, M.; Nyholm, L.; Stromme, M. J. Mater. Sci. 2012, 5317-5325.
Razaq, A.; Nyholm, L.; Sjödin, M.; Strømme, M.; Mihranyan, A. Adv. Energy Mater. 2012, 445-454.
Jabbour, L.; Destro, M.; Chaussy, D.; Gerbaldi, C.; Penazzi, N.; Bodardo, S.; Beneventi, D. Cellulose 2013, 571-582.
Chun, S. J.; Choi, E. S.; Lee, E. H.; Kim, J. H.; Lee, S. Y.; Lee, S. Y. J. Mater. Chem. 2012, 16618-16626.

(56) References Cited

OTHER PUBLICATIONS

Xu, S.; Zhang, Y.; Cho, J.; Lee, J.; Huang, X.; Jia, L.; Fan, J. A.; Su, Y.; Su, J.; Zhang, H.; Cheng, H.; Lu, B.; Yu, C.; Chuang, C.; Kim, T. I.; Song, T.; Shigeta, K.; Kang, S.; Dagdeviren, C.; Petrov, I.; Braun, P. V.; Huang, Y.; Paik, U.; Rogers, R. A. Nat. Commun. 2013, 1543.
Jost, K.; Perez, C. R.; McDonough, J. K.; Presser, V.; Heon, M.; Dion, G.; Gogotsi, Y. Energy Environ. Sci. 2011, 5060-5067.
Sun, C.; Zhu, H.; Baker, E. B., III; Okada, M.; Wan, J.; Ghemes, A.; Inoue, Y.; Hu, L.; Wang, Y. Nano Energy 2013, DOI: 10.1016/j.nanoen.2013.03.020.
Liu, Y.; Gorgutsa, S.; Santato, C.; Skorobogatiy, M. J. Electrochem. Soc. 2012, A349-A356.
Hu, L.; Choi, J. W.; Yang, Y.; Jeong, S.; LaMantia, F ; Cui, L. F.; Cui, Y. Proc. Natl. Acad. Sci. U.S.A. 2009, 21490.
Hu, L.; Wu, H.; LaMantia, F.; Yang, Y.; Cui, Y. ACS Nano 2011, 5843-5848.
Gui, Z.; Zhu, H.; Gillette, E.; Han, X.; Rubloff, G. W.; Hu, L.; Lee, S. B. ACS Nano 2013, 6037-6046.
Kang, Y. J.; Chun, S. J.; Lee, S. S.; Kim, B. Y.; Kim, J. H.; Chung, H.; Lee, S. Y.; Kim, W. ACS Nano 2012, 6400-6406.
Kang, Y. R.; Li, Y. L.; Hou, F.; Wen, Y. Y.; Su, D. Nanoscale 2012, 3248-3253.
Weng, Z.; Su, Y.; Wang, D. W.; Li, F.; Du, J.; Cheng, H. M. Adv. Energy Mater. 2011, 917-922.
Zheng, G.; Hu, L.; Wu, H.; Xie, X.; Cui, Y. Energy Environ. Sci. 2011, 3368-3373.
Chen, P.; Chen, H.; Qiu, J.; Zhou, C. Nano Res. 2010, 594-603.
Zhong, Q.; Zhong, J.; Hu, B.; Hu, Q.; Zhou, J.; Wang, Z. L. Energy Environ. Sci. 2013, 1779-1784.
Fan, K.; Peng, T.; Chen, J.; Zhang, X.; Li, R. J. Mater. Chem. 2012, 16121-16126.
Zhang, L.; Zhou, M.; Wen, D.; Bai, L.; Lou, B.; Dong, S. Biosens. Bioelectron. 2012, 155-159.
Xie, X.; Pasta, M.; Hu, L.; Yang, Y.; McDonough, Y.; Cha, J.; Criddle, C. S.; Cui, Y. Energy Environ. Sci. 2011, 1293-1297.
Gardner, J. P.; Mather, J. C.; Clampin, M.; Doyon, R.; Greenhouse, M. A.; Hammel, H. B.; Hutchings, J. B.; Jakobsen, P.; Lilly, S. J.; Long, K. S.; Lunine, J. I.; McCaughrean, M. J.; Mountain, M.; Nella, J.; Rieke, G. H.; Rieke, M. J.; Rix, H. W.; Smith, E. P.; Sonneborn, G.; Stiavelli, M.; Stockman, H. S.; Windhorst, R. A.; Wright, G. S. Space Sci. Rev. 2006, 485-606.
Ahn, B. Y.; Shoji, D.; Hansen, C. J.; Hong, E.; Dunand, D. C.; Lewis, J. A. Adv. Mater. 2010, 2251-2254.
Wei, Z. Y.; Guo, Z. V.; Dudte, L.; Liang, H. Y.; Mandevan, L. Phys. Rev. Lett. 2013, 215501.
Schenk, M.; Guest, S. D. Proc. Natl. Acad. Sci. U.S.A. 2013, 3276.
An, B.; Benbernou, N.; Demaine, E. D.; Rus, D. Robotica 2011, 87-102. Nano Letters Letter 4973 dx.doi.org/10.1021/nl4030374 | Nano Lett. 2013, 13, 4969-4974.
Wang, C.; Nosaka, T.; Yost, B.; Zimmerman, B.; Sutton, E. D.; Kincaid, E.; Keberle, K.; Iqbal, Q. A.; Mendez, R.; Markowitz, S.; Liu, P.; Alford, T. L.; Chan, C. K.; Chan, K. S.; O'Connell, M. J. Mater. Res. Lett. 2013, 13-18.
Hawkes, E.; An, B.; Benbernou, N. M.; Tanaka, H.; Kim, S.; Demaine, E. D.; Rus, D.; Wood, R. J. Proc. Natl. Acad. Sci. U.S.A. 2010, 12441-12445.
Onal, C. D.; Wood, R. J.; Rus, D. IEEE Int. Conf. Rob. Autom. 2011, 4608-4613.
Paik, J. K. IEEE/RSJ Int. Conf. Intell. Robots Syst. 2011, 414-420.
Miura, K. Map fold a la miura style, its physical characteristics and application to the space science. In Research of Pattern Formation; Takaki, R., Ed.; KTK Scientific Publishers: Tokyo, 1994; pp. 77-90.
Nishiyama, Y. Int. J. Pure Appl. Math. 2012, 269-279.
Miura, K. Method of packaging and deployment of large membranes in space; Technical Report for The Institute of Space and Astronautical Science. Report No. 618, Dec. 1985.
Gaynor, J. F.; Senkevich, J. J.; Desu, S. B. J. Mater. Res. 1996, 1842-1850.
John, J.; Li, Y.; Zhang, J.; Loeb, J. A.; Xu, Y. J. Micromech. Microeng. 2011, 105011.
Kim, E.; Tu, H.; Lv, C.; Jiang, H.; Yu, H.; Xu, Y. Appl. Phys. Lett. 2013, 033506.
Katragadda, R. B.; Xu, Y. Sens. Actuators, A 2008, 169-174.
Lunnon, W. F. Math. Comp. 1968, 192-199.
Demaine, E. D.; O'Rourke, J. A survey of folding and unfolding in computational geometry. In Combinatorial and computational geometry; Goodman, J. E., Pach, J., Welzl, E., Eds.; Mathematical Sciences Research Institute Publications: Cambridge University Press: New York, 2005; pp. 167-211.
Balkcom, D. J.; Mason, M. T. Int. J. Robot. Res. 2008, 613-627.
Song, Z. et al. 'Origami Lithium-ion batteries'. Nature Communications. Jan. 28, 2014. vol. 5. Article No. 3140. pp. 1-6.
Long, J. W. et al. 'Three-dimensional battery architectures'. Chemical Reviews. 2004. vol. 104. No. 10. pp. 4463-4492.
Cheng, Q. et al. 'Folding paper-based lithium batteries for higher areal energy densities'. Nano Letters. Sep. 23, 2013. vol. No. 10. pp. 4969-4974.
Chen Y, Au J, Kazlas P, Ritenour A, Gates H, McCreary M. Flexible active-matrix electronic ink display. Nature 423, 136-136 (2003).
Gelinck GH, et al. Flexible active-matrix displays and shift registers based on solution-processed organic transistors. Nat Mater 3, 106-110 (2004).
Kim S, et al. Low-Power Flexible Organic Light-Emitting Diode Display Device. Adv Mater 23, 3511-+ (2011).
Yoon B, Ham DY, Yarimaga O, An H, Lee CW, Kim JM. Inkjet Printing of Conjugated Polymer Precursors on Paper Substrates for Colorimetric Sensing and Flexible Electrothermochromic Display. Adv Mater 23, 5492-+ (2011).
Kim DH, et al. Stretchable and foldable silicon integrated circuits. Science 320, 507-511 (2008).
Ko HC, et al. A hemispherical electronic eye camera based on compressible silicon optoelectronics. Nature 454, 748-753 (2008).
Kim DH, et al. Epidermal Electronics. Science 333, 838-843 (2011).
Pushparaj VL, et al. Flexible energy storage devices based on nanocomposite paper. Proc Natl Acad Sci U S A 104, 13574-13577 (2007).
Scrosati B. Nanomaterials—Paper powers battery breakthrough. Nat Nanotechnol 2, 598-599 (2007).
Gao KZ, et al. Paper-based transparent flexible thin film supercapacitors. Nanoscale 5, 5307-5311 (2013).
Wang JZ, et al. Highly flexible and bendable free-standing thin film polymer for battery application. Mater Lett 63, 2352-2354 (2009).
Hu LB, Wu H, La Mantia F, Yang YA, Cui Y. Thin, Flexible Secondary Li-Ion Paper Batteries. ACS Nano 4, 5843-5848 (2010).
Ihlefeld JF, Clem PG, Doyle BL, Kotula PG, Fenton KR, Apblett CA. Fast Lithium-Ion Conducting Thin-Film Electrolytes Integrated Directly on Flexible Substrates for High-Power Solid-State Batteries. Adv Mater 23, 5663-+ (2011).
Koo M, et al. Bendable Inorganic Thin-Film Battery for Fully Flexible Electronic Systems. Nano Lett 12, 4810-4816 (2012).
Yu CJ, Masarapu C, Rong JP, Wei BQ, Jiang HQ. Stretchable Supercapacitors Based on Buckled Single-Walled Carbon Nanotube Macrofilms. Advanced Materials 21, 4793-+ (2009).
Li X, Gu TL, Wei BQ. Dynamic and Galvanic Stability of Stretchable Supercapacitors. Nano Lett 12, 6366-6371 (2012).
Hu LB, et al. Stretchable, Porous, and Conductive Energy Textiles. Nano Lett 10, 708-714 (2010).
Kuribayashi K, et al. Self-deployable origami stent grafts as a biomedical application of Ni-rich TiNi shape memory alloy foil. Mater Sci Eng A-Struct Mater Prop Microstruct Process 419, 131-137 (2006).
Belcastro S-M, Hull TC. Modeling the folding of paper into three dimensions using affine transformations. Linear Algebra and its Applications 348, 273-282 (2002).
PCT/US2014/072354 International Search Report and Written Opinion of the International Searching Authority dated Apr. 13, 2015 (15 pages).
PCT/US2014/011710 International Search Report and Written Opinion of the International Searching Authority dated May 12, 2014 (7 pages).

(56) References Cited

OTHER PUBLICATIONS

PCT/US2015/059006 International Search Report and Written Opinion of the International Searching Authority dated Feb. 17, 2016 (7 pages).
Sant et al., "An in situ heater for a phase-change-material-based actuation system," J. Micromech. Microeng. 2. 085-39 (2010).
Yang et al., "A latchable microvalve using phase change of paraffin wax," Sensors and Actuators A 134, pp. 194-200 (2007).
Äyräs P. et al., "Diffraction Gratings in Sol-gel Films by Direct Contact Printing Using a UV-mercury Lamp" 162 Opt. Comms. 215-218 (1999).
Fang Y. et al., "Resonant Waveguild Grating Biosensor for Living Cell Sensing" 91 Biophys. J. 1925-940 (2006).
Gudeman CS. et al., "Using the Grating Lite Valve Device as a Multichannel Variable Optical Attenuator (VOA) for the 1.55-μm Spectral Region" 4653 Proc. SPIE 56-61 (2002).
Albert K. Harris et al., "Silicone Rubber Substrata: A New Wrinkle in the Study of Cell Locomotion" 208 Science 177-179 (1980).
Huang R., "Kinetic Wrinkling of an Elastic Film on a Viscoelastic Substrate" 53 J. Mech. Phys. Solids 63-89 (2005).
Z. Y. Huang et al., "Nonlinear Analyses of Wrinkles in a Film Bonded to a Compliant Substrate" 53 J. Mech. Phys. Solids 2101-118 (2005).
Wilhelm T. S. Huck et al., "Ordering of Spontaneously Formed Buckles on Planar Surfaces" 16 Langmuir 3497-501 (2000).
Hanqing Jiang et al., "Finite Width Effect of Thin-films Buckling on Compliant substrate: Experimental and Theoretical Studies" 56 J. Mech. Phys. Solids 2585-598 (2008).
Cunjiang Yu et al., "Thermoresponsiveness of Integrated Ultra-Thin Silicon with Poly(N-isopropylacrylamide) Hydrogels" 32 Macromol. Rapid Commun. 820 (2011).
Cunjiang Yu et al., "Silicon Thin Films as Anodes for High-Performance Lithium-Ion batteries with Effective Stress Relaxation" 2 Adv. Energy Mater. 68 (2012).
David C. Duffy et al., "Rapid Prototyping of Microfluidic Systems in Poly(dimethylsiloxane)" 70 Anal. Chem. 4974 (1998).
Daniel H. Raguin and G. Michael Morris, "Antireflection Structured Surfaces for the Infrared Spectral Region" 32 Appl. Opt. 1154-167 (1993).
Christopher M. Stafford et al., "A Buckling-based Metrology for Measuring the Elastic Moduli of Polymetric Thin Films" 3 Nat. Mater. 545-550 (2004).
Chee Wei Wong et al., "Analog Tunable Gratings Driven by Thin-film Piezoelectric Microelectromechanical Actuators" 42 Appl. Opt. 621-626 (2003).
A. Azzam Yasseen et al., "Diffraction Grating Scanners Using Polysilicon Micromotors" 5 IEEE J. Sel. Top. Quantum Electron. 75-82 (1999).
M. Ouyang et al., "Conversion of Some Siloxane Polymers to Silicon Oxide by UV/Ozone Photochemical Processes" 12 Chem. Mater. 1591 (2000).
E. Cerda et al., "Thin Films: Wrinkling of an Elastic Sheet Under Tension" 419 Nature 579 (2002).
Christopher Harrison et al., "Sinusoidal Phase Grating Created by a Tunably Buckled Surface" 85 Appl. Phys. Lett. 4016-4018 (2004).
Ned Bowden et al., "Spontaneous Formation of Ordered Structures in Thin Films of Metals Supported on an Elastomeric Polymer" 393 Nature 146-149 (1998).
Takuya Ohzono and Masatsugu Shimomura, "Geometry-dependent Stripe Rearrangement Processes Induced by Strain on Preordered Microwrinkle Patterns" 21 Langmuir 7230-7237 (2005).
Kevin Chen et al., "Facile Large-area Photolithography of Periodic Sub-micron Structures Using a Self-formed Polymer Mask" 100 App. Phys. Lett 233503 (2012).
F.S. Chen et al., "Holographic Storage in Lithium Niobate" 13 Appl. Phys. Lett. 223 (1968).
Kahp Y. Suh et al., "A Simple Soft Lithographic Route to Fabrication of Poly(ethylene glycol) Microstructures for Protein and Cell Patterning" 25 Biomaterials 557 (2004).

Anne Horn et al., "Ordering and Printing Virus Arrays: A straightforward Way to Functionalize Surfaces" 6 Small 2122 (2010).
Jonathan G. C. Veinot et al., "Fabrication and Properties of Organic Light-Emitting "Nanodiode" Arrays" 2 Nano.Lett. 333 (2002).
Yoshihiro Koide et al., "Hot Microcontact Printing for Patterning ITO Surfaces. Methodology, Morphology, Microstructure, and OLED Charge Injection Barrier Imaging" 19 Langmuir 86 (2003).
Cunjiang Yu et al., "Tunable Optical Gratings Based on Buckled Nanoscale Thin Films on Transparent Elastomeric Substrates" 96 Appl. Phys. Lett. 041111 (2010).
Zhiyong Fan et al., "Three-dimensional Nanopillar-array Photovoltaics on Low-cost and Flexible Substrates" 8 Nat. Mat. 648 (2009).
C. Vieu et al., "electron Beam Lithography: Resolution Limits and Applications" 164 Appl. Surf. Sci. 111 (2000).
Burn Jeng Lin, "Deep UV Lithography" 12 J. Vac. Sci. Technol. 1317 (1975).
Leon A. Woldering et al., "Periodic Arrays of Deep Nanopores Made in Silicon with Reactive Ion Etching and Deep UV Lithography" 19 Nanotechnology 145304 (2008).
Dong Sik Kim et al., "Laser-Interference Lithography Tailored for Highly Symmetrically Arranged ZnO Nanowire Arrays" 3 Small 76 (2007).
Johannes de Boor et al., "Three-beam Interference Lithography: Upgrading a Lloyd's Interferometer for Single-exposure Hexagonal Patterning" 34 Opt. Lett. 1783 (2009).
Ampere A Tseng et al., "Nanofabrication by Scanning Probe Microscope Lithography: A Review" 23 J. Vac. Sci. Technol. B 877 (2005).
Younan Xia et al., "Unconventional Methods for Fabricating and Patterning Nanostructures" 99 Chem. Rev. 1823 (1999).
L. Jay Guo, "Nanoimprint Lithography: Methods and Material Requirements" 19 Adv. Mater. 495 (2007).
Helmut Schift, "Nanoimprint Lithography: An Old Story in Modern Times? A Review" 26 J. Vac. Sci. Technol. B 458 (2008).
J. Y. Cheng et al., "Fabrication of Nanostructures with Long-range Order Using Block Copolymer Lithography" 81 Appl. Phys. Lett. 3657 (2002).
Tae-Woo Lee et al., "Soft-Contact Optical Lithography Using Transparent Elastomeric Stamps: Application to Nanopatterned Organic Light-Emitting Devices" 15 Adv. Funct. Mater. 1435 (2005).
John A. Rogers et al., "Using an Elastomeric Phase Mask for Sub-100nm Photolithography in the Optical Near Field" 70 Appl. Phys. Lett. 2658 (1997).
Dong Qin et al., "Photolithography with Transparent Reflective Photomasks" 16 J. Vac. Sci. Technol. B 98 (1998).
Zhi-Yuan Li et al., "Optimization of Elastomeric Phase Masks for Near-field Photolithography" 78 Appl. Phys. Lett. 2431 (2001).
John A. Rogers et al., "Generating ~90 Nanometer Features Using Near-field Contact-mode Photolithography with an Elastomeric Phase Mask" 16 J. Vac. Sci. Technol. B 59 (1998).
Daniel J. Shir et al., "Three-Dimensional Nanofabrication with Elastomeric Phase Masks" 111 J. Phys. Chem. B 12945 (2007).
Alexandra Schweikart and Andreas Fery, "Controlled Wrinkling as a Novel Method for the Fabrication of Patterned Surfaces" 165 Microchim. Acta 249 (2009).
Won Mook Choi et al., "Biaxially Stretchable "Wavy" Silicon Nanomembranes" 7 Nano Lett. 1655 (2007).
Kirill Efimenko et al., "Nested Self-similar Wrinkling Patterns in Skins" 4 Nat. Mater. 293 (2005).
Byung-Ho Jo et al., "Three-Dimensional Micro-Channel Fabrication in Polydimethylsiloxane (PDMS) Elastomer" 9 J. Microelectromech. Syst. 76 (2000).
Conghua Lu et al., "A Lithography-free Method for Directed Colloidal Crystal Assembly Based on Wrinkling" 3 Soft Matter 1530 (2007).
Heinz Schmid et al., "Preparation of Metallic Films on Elastomeric Stamps and their Application for Contact Processing and Contact Printing" 13 Adv. Funct. Mater. 145 (2003).
Cheryl S. Selvanayagam et al., "Nonlinear Thermal Stress/Strain Analyses of Copper Filled TSV (Through Silicon Via) and their Flip-Chip Microbumps" 32 III Trans. Adv. Pack. 720 (2009).

(56) References Cited

OTHER PUBLICATIONS

James S. Sharp and Richard. A. L. Jones, "Micro-buckling as a Route Towards Surface Patterning" 14 Adv. Mater. 799 (2002).
Pimpon Uttayarat et al., "Topographic Guidance of endothelial Cells on Silicone Sufraces with Micro- to Nanogrooves: Orientation of Actin Filaments and Focal Adhesions" 75 J. Biomed. Mater. Res. A 668 (2005).
Cunjiang Yu and Hanquing Jiang, "Forming Wrinkled Stiff Films on Polymeric Substrates at Room Temperature for Stretchable Interconnects Applications" 519 Thin Solid Films 818 (2010).
C. Yu et al., "Stretchable Supercapacitors Based on Buckled Single-Walled Carbon Nanotube Macrofilms", Adv. Mater., 21, pp. 4793-4797 (2009).
C. Yu et al., "A stretchable temperature sensor based on elastically buckled thin film devices on elastomeric substrates", Appl. Phys. Lett. 95, 141902 (2009).
H. Jiang et al., "Finite deformation mechanics in buckled thin films on compliant supports", PNAS, vol. 104., No. 40, pp. 15607-15612 (2007).
D.-Y. Khang et al., "A Stretchable Form of Single-Crystal Silicon for High-Performance Electronics on Rubber Substrates", Science, vol. 311 pp. 208-212 (2006).
S.P. Lacour et al., "Stretchable Interconnects for Elastic Electronic Surfaces", Proc. IEEE, vol. 93, No. 8, pp. 1459-1467 (2005).
International Search Report and Written Opinion for PCT/US2014/065776, dated Apr. 22, 2015.
T Ma et al., "Micro-strain sensing using wrinkled stiff thin films on soft substrates as tunable optical grating", Optics Express, vol. 21, No. 10, pp. 11994-12001 (2013).
X. Jiang et al., "Controlling Mammalian Cell Spreading and Cytoskeletal Arrangement with Conveniently Fabricated Continuous Wavy Features on Poly(dimethylsiloxane)", Langmuir 18(8), 3273-3280 (2002).
S. Wagner et al., "Electronic skin: architecture and components," Physica E 25(2-3), 326-334 (2004).
S. P. Lacour et al., "Design and performance of thin metal film interconnects for skin-like electronic circuits," IEEE Electron Device Lett. 25(4), 179-181 (2004).
S. P. Lacour et al., "Stretchable gold conductors on elastomeric substrates," Appl. Phys. Lett. 82(15), 2404-2406 (2003).
S. P. Lacour, S. Wagner, R. J. Narayan, T. Li, and Z. Suo, "Stiff subcircuit islands of diamondlike carbon for stretchable electronics," J. Appl. Phys. 100(1), 014913 (2006).
H. Q. Jiang et al., "Mechanics of precisely controlled thin film buckling on elastomeric substrate," Appl. Phys. Lett. 90(13), 133119 (2007).
K.M. Choi et al., "A photocurable poly(dimethylsiloxane) chemistry designed for soft lithographic molding and printing in the nanometer regime," J. Am. Chem. Soc. 125(14), 4060-4061 (2003).
Song et al., "Origami 1 ithiwn-ion batteries," brochure, Nature Communications, Jan. 8, 2014, vol. 5, article No. 3140, pp. 1-6 see pp. 2-3; Methods in p. 6; figure 1.
Xu et al., "Stretchable batteries with self-similar serpentine interconn. ects and integrated wireless recharging systems", Nature Communications, Feb. 26, 2013, vol. 4, article No. 1543, pp. 1-8 see abstract; pp. 2-4; Methods in p. 7; figures 1-3.
PCT/US2015/052205 International Search Report and Written Opinion of the International Searching Authority dated Dec. 23, 2015 (9 pages).
PCT/US2015/068038 International Search Report and Written Opinion of the International Searching Authority dated May 4, 2016 (9 pages).
Asundi et al., "Optical strain sensor using position-sensitive detector and diffraction grating: error analysis," Optical Engineering 39.6 (2000): 1645-1651.
Chinese Patent Office Action for Application No. 201580077410.9 dated Jul. 26, 2019 (14 pages, English translation included).
Crone, B. et al., "Large-scale complementary integrated circuits based on organic transistors", Nature, Feb. 2000, vol. 403, No. 6769, pp. 521-523 <DOI:10.1038/35000530>.
Fan, J. et al., "Fractal design concepts for stretchable electronics", Nature Communications, Feb. 2014, vol. 5, article 3266, 9 pages <DOI:10.1038/ncomms4266>.
Garnier, F. et al., "All-polymer field-effect transistor realized by printing tec", Science, Sep. 1994, vol. 265, No. 5179, pp. 1684-1685.
Ghaedi, M., "The Wonderfuls of Fibonacci Numbers in the Hidden Nature," Proceedings of Fifth IRAJ International Conference (Pune, India, Sep. 15, 2013), 2013, pp. 90-96.
Kelley, T. et al., "Recent Progress in Organic Electronics: Materials, Devices, and Processes", Chemistry of Materials, Nov. 2004 (available online Jul. 2004), vol. 16, No. 23, pp. 4413-4422 <DOI:10.1021/cm049614j>.
Kim, D-H. et al., "Materials and noncoplanar mesh designs for integrated circuits with linear elastic responses to extreme mechanical deformations", Proceedings of the National Academy of Sciences, Dec. 2008, vol. 105, No. 48, pp. 18675-18680 <DOI:10.1073/pnas.0807476105>.
Kim, K et al., "Large-scale pattern growth of graphene films for stretchable transparent electrodes", Nature, Feb. 2009, vol. 457, No. 7230, pp. 706-710 <DOI:10.1038/nature07719>.
LV, C. et al., "Archimedean spiral design for extremely stretchable interconnects", Extreme Mechanics Letters, Dec. 2014, vol. 1, pp. 29-34 <DOI:10.1016/j.eml.2014.12.008>.
LV, C. et al., "Origami based Mechanical Metamaterials", Scientific Reports, Aug. 2014, vol. 4, No. 5979, 6 pages <DOI:10.1038/srep05979>.
Song, J. et al., "Mechanics of noncoplanar mesh design for stretchable electronic circuits", Journal of Applied Physics, Jun. 2009, vol. 105, No. 123516, 6 pages <DOI:10.1063/1.3148245>.
Song, Z. et al., "Kirigami-based stretchable lithiumion batteries", Scientific Reports, Jun. 2015, vol. 5, No. 10988, 9 pages <DOI:10.1038/srep10988>.
Tang, R. et al., "Origami-enabled deformable silicon solar cells", Applied Physics Letters, Feb. 2014, vol. 104, article 083501, 5 pages <DOI:10.1063/1.4866145>.
Widlund, T. et al., "Stretchability and compliance of freestanding serpentine-shaped ribbons", International Journal of Solids and Structures, Nov. 2014 (available online Aug. 2014), vol. 51, No. 23-24, pp. 4026-4037 DOI:10.1016/j.ijsolstr.2014.07.025>.
Yamada, T. et al., "A stretchable carbon nanotube strain sensor for human-motion detection", Nature Nanotechnology, May 2011 (published online Mar. 2011), vol. 6, No. 5, pp. 296-301 <DOI:10.1038/nnano.2011.36>.
Zhang, Y. et al., "A hierarchical computational model for stretchable interconnects with fractal-inspired designs", Journal of the Mechanics and Physics of Solids, Dec. 2014 (available online Aug. 2014), vol. 72, pp. 115-130 <DOI:10.1016/j.jmps.2014.07.011>.
Zhang, Y. et al., "Buckling in serpentine microstructures and applications in elastomer-supported ultra-stretchable electronics with high areal coverage", Soft Matter, Jun. 2013, vol. 9, No. 33, pp. 8062-8070 <DOI:10.1039/C3SM51360B>.
Zhang, Y. et al., "Mechanics of ultra-stretchable self-similar serpentine interconnects", Acta Materialia, Dec. 2013 (available online Oct. 2013), vol. 61, No. 20, pp. 7816-7827 <DOI:10.1016/j.actamat.2013.09.020>.
Sun, Y. et al., "Controlled buckling of semiconductor nanoribbons for stretchable electronics", Nature Nanotechnology, Dec. 2006, vol. 1, pp. 201-206 <DOI:10.1038/nnano.2006.131>.
Tu, H. et al., "Hybrid silicon-polymer platform for self-locking and self-deploying origami", Applied Physics Letters, Dec. 2013, vol. 103, article 241902, 4 pages <DOI:10.1063/1.4842235>.
Gonzalez, M. et al., "Design of metal interconnects for stretchable electronic circuits", Microelectronics Reliability, Jun. 2008, vol. 48, No. 6, pp. 825-832 <DOI:10.1016/j.microrel.2008.03.025>.
Gaikwad, A. et al., "A flexible high potential printed battery for powering printed electronics", Applied Physics Letters, Jun. 2013, vol. 102, No. 23, article 233302, 5 pages <DOI:10.1063/1.4810974>.
Bainbridge, I et al., "The Surface Tension of Pure Aluminum and Aluminum Alloys", Metallurgical and Materials Transactions A,

(56) References Cited

OTHER PUBLICATIONS

Aug. 2013 [available online Mar. 2013], vol. 44A, pp. 3901-3909 <DOI:10.1007/s11661-013-1696-9>.

* cited by examiner

ARCHIMEDEAN SPIRAL DESIGN FOR DEFORMABLE ELECTRONICS

CROSS-REFERENCE TO RELATED APPLICATIONS

This application is a continuation of International Application No. PCT/US2015/068038 filed on Dec. 30, 2015, which claims priority to U.S. Provisional Patent Application No. 62/099,324, filed on Jan. 2, 2015. The entire content of these disclosures are incorporated herein by reference.

FIELD OF THE INVENTION

This application relates to deformable electronic devices, particularly, to spiral-shaped electrical interconnects to be used in island-interconnect deformable electronic devices.

BACKGROUND OF THE INVENTION

Recent years have witnessed the rapid development of deformable electronic devices, which are emerging as an attractive and promising new technology. Such electronics can be incorporated into wearable devices, such as flexible displays, stretchable circuits, hemispherical electronic eyes, and epidermal devices, to name a few. With deformable electronics, devices can be made to fit into a variety of physical spaces without the standard geometric constraints of non-deformable electronic devices. Indeed, such devices may be developed on the nano-, micro-, centi-, or meter level scale for various applications.

Many methods have been utilized to form deformable electronic devices and there are generally two conventional approaches. The first approach is to use organic materials that are intrinsically stretchable to form the electronic devices; however, such organic materials are undesirable for use in high-performance electronics because they have low electrical mobility (i.e., ability for charged particles to move through a medium in response to an electric field). The second approach utilizes an "island-interconnect" structure where multiple inorganic electronic devices are each placed on a rigid island (e.g., substrate) and electrically connected by interconnects that are stretchable, thus making the entire island-interconnect system stretchable. The island-interconnect structures are typically supported by elastomeric substrates, and recent developments in foldable electronics utilize the concept of paper folding (i.e., origami) to increase the flexibility and deformability of the resulting structures. Indeed, one major objective is to improve the flexibility and deformability of stretchable electronic devices to allow them to be used in an even wider variety of applications than was previously possible. With the island-interconnect method, known interconnects are patterned to form a serpentine shape or a semi-similar serpentine shape to improve deformability. The serpentine-based design utilizes the concept of kirigami (i.e., paper-cutting) to make non-straight lines from a two-dimensional plane, such that in-plane stretching is compensated by out-of-plane deformation. However, even the serpentine-based design is limited in its stretchability capacity.

Accordingly, additional methods of forming interconnects that improve stretchability are desired, such that electronic devices with wide functionality and improved portability may be developed.

SUMMARY OF THE INVENTION

To improve deformability of island-interconnect structures, the invention is directed to spiral-based interconnects, which are more stretchable than conventional serpentine-based interconnects.

Accordingly, one aspect of the invention is directed to an electronic device which includes a first functional body, a second functional body, and at least one connection member connecting the first functional body to the second functional body, wherein the at least one connection member has a spiral pattern and is suspended in air to allow for stretching, flexing or compressing.

Other aspects of the invention will become apparent by consideration of the detailed description and accompanying drawings.

BRIEF DESCRIPTION OF THE DRAWINGS

These and other features of the preferred embodiments of the invention will become more apparent in the detailed description in which reference is made to the appended drawings wherein.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

The invention is directed generally to spiral-based interconnect geometries for use in island-interconnect deformable electronic devices. Deformable electronic devices typically include a plurality of individual electronic devices which are electrically connected by connection member(s), also known as interconnects. The connection members are electrically conductive so as to allow electrical signals to be conducted between the individual devices. The electronic devices are not particularly limited and may be, for example, energy storage and energy source devices (e.g., batteries, solar cells, and supercapacitors), consumer products (e.g., foldable displays, illumination devices, antenna, and foldable toys), and wearable electronics (e.g., health monitoring systems and communication systems). The interconnect geometries of the invention allow these products to be made more compact, portable and durable without sacrificing performance.

As set forth herein, and without being bound by any particular theory, it is believed that a spiral-shaped interconnect allows for increased stretchability of the island-interconnect device. It is believed that a uniform and small curvature in a spiral pattern used for the interconnect contributes to a greater stretchability. Instead of applying a periodic pattern to the design of the interconnect, a non-periodic pattern provides a higher degree of freedom during the design process, especially under certain extreme conditions.

As set forth herein, the spiral interconnect geometries have a higher stretchability as compared to known serpentine-based interconnect geometries. The spiral interconnects are stretchable up to 250% under elastic deformation and up to 325% without failure.

Figure 1A:
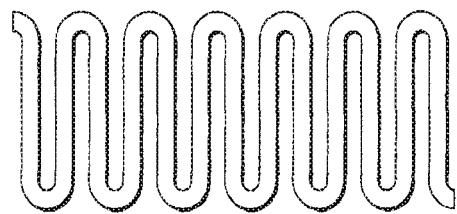
FIGS. 1(A)-1(C) are top view drawings of three interconnect structure geometries according to an embodiment of the invention.
Figure 1B:
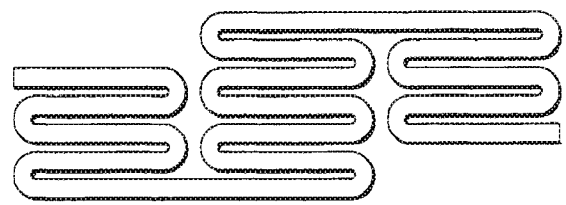
Figure 1C:
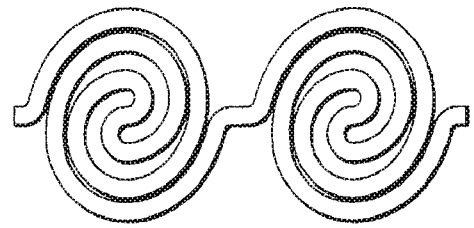

Exemplary in-plane shapes of three interconnect patterns (also referred to as "connection members") are shown in FIGS. 1(A)-(C) as follows: regular serpentine (FIG. 1(A)) self-similar serpentine (FIG. 1(B)) and Archimedean spiral structure 100 (FIG. 1(C)). The regular serpentine (FIG. 1(A)) has been extensively used in forming interconnects and is known in the art, and the self-similar serpentine pattern (FIG. 1(B)) has been recently studied. The Archimedean spiral structure 100 illustrated in FIG. 1(C) is the primary object of this invention.

The interconnects of FIGS. 1(A)-(C) may be formed from a material configured to withstand the imposed bending stress formed when adjacent and adjoined functional bodies are moved relative to one another to form a resulting electronic device. In one embodiment, the interconnect may include at least one flexible layer (not shown). For example, the interconnect can be formed of a relatively soft material, such as a polymer, gel, and the like. The polymer, for example, can be poly-para-xylylene or an electrically conductive polymer (Parylene-C, polyimide, polydimethylsiloxane (PDMS)). Alternatively, the interconnect can be formed of any conductive material known in the art suitable for use as a conductor, such as metals (e.g., copper, chromium, aluminum, gold, silver, iron, cobalt, titanium, etc.), nano fibers, conductive oxides (e.g., ZnO, indium tin oxide (ITO), fluorine doped tin oxide (FTO), $ReO_3$, $IrO_2$, $CrO_2$, etc.), and positive temperature coefficient thermistors (PTC) and negative temperature coefficient thermistors (NTC).

In another example, the interconnect can be formed from a plurality of layers, such as a first layer forming a top or bottom of the interconnect, or double layers on both the top and bottom of the interconnect, and/or multiple layers as necessary depending on the requirements of a particular application.

Each of the geometries illustrated in FIGS. 1 (A)-(C) may have any dimensions suitable for a particular use and known to one skilled in the art. In one exemplary embodiment illustrated in FIGS. 2(A)-(C), each of the patterns are formed of an interconnect body 102 having a thickness (not shown) of about 1 micron and an interconnect body width (w) of about 40 microns. The radius (r) of the regular serpentine of FIG. 2(A) and the semi-similar serpentine of FIG. 2(B) is about 20 μm and 10 μm, respectively. The length (l) of each serpentine fold for the regular serpentine is about 310 microns, and lengths ($l_1$,$l_2$) of each serpentine fold for the self-similar serpentine are 235 microns and 580 microns, respectively. These dimensions are provided only by way of example and any dimensions suitable for a particular use or application may be used.

In one exemplary embodiment, the Archimedean spiral structure 100 may be prescribed by an analytical function in the polar coordinate as $r=A\cdot\theta^q$, wherein r is the radius of the spiral pattern. $\theta=[0, 3\pi]$, A is a geometrical pre-factor, and q is the power which determines the shape of the function. There is no limit on the value of variables A or q, which are related and which dictate the shape of the spiral pattern. In another exemplary embodiment, the Archimedean spiral structure 100 is prescribed by an analytical function in the polar coordinate as $r=\pm 60\theta^{1/1.7}$, $\theta=[0,3\pi]$ wherein r is the radius of the spiral pattern. In one embodiment, the body width (w) of the spiral structure 100 is about 40 microns. In this way, all three patterns (FIGS. 2(A)-(C)) have approximately the same span of about 1,000 μm in the x-direction, the same height of about 400 μm in the y-direction, and the same contour length of about 5,650 μm. In one embodiment where copper is used to form the interconnects, the Young's modulus E is 119 GPa, and the Poisson's ratio v is 0.34. Plasticity is considered and described by $\sigma=E\varepsilon_y+E_p\varepsilon_p^n$ with $\varepsilon_y=0.3\%$ as the yield strain, $E_p=530$ MPa, and $n=0.44$.

Figure 2A:
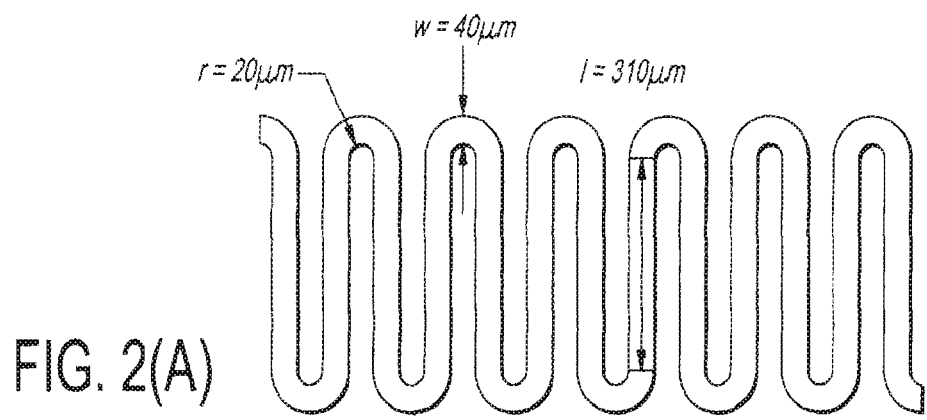
FIGS. 2(A)-(C) are top view drawings of the three interconnect structure geometries illustrated in FIGS. 1(A)-(C) showing exemplary dimensions for each according to an embodiment of the invention.
Figure 2B:
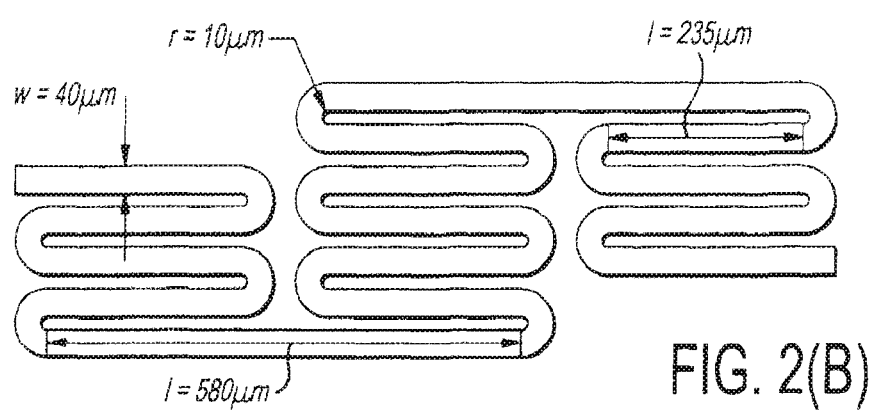
Figure 2C:
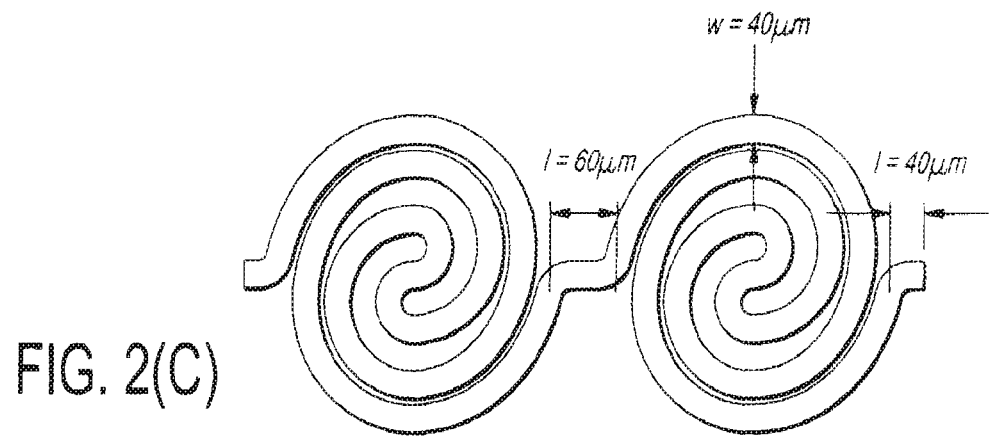

To compare the interconnect geometries of FIGS. 2(A)-(C), a uniform criterion was developed. For a typical island-interconnect structure, at the unstrained state, the islands, also referred to as functional bodies, should occupy the majority of the in-plane area to increase the areal coverage. By way of example, a 2 mm×2 mm island and a 1 mm gap between islands may be utilized, where a 2 mm×2 mm island size is consistent with the size of some small conventional electronic chips and the areal coverage can achieve over 45%. As such, the area to be filled in by the interconnects, i.e., connection members, is 2 mm×1 mm. In this area, one interconnect or a plurality of interconnects may be used. Taking into consideration electrical conductivity of the resulting structure, the use of a plurality of interconnects is preferred since the breaking of one interconnect does not cause the electrical failure of the entire structure. Accordingly, in one embodiment, four identical interconnects are placed in the gap between each island and each interconnect occupies no more than 0.5 mm (height)×1 mm (width) of space. Another criterion to uniformly compare the stretchability among the different interconnects illustrated in FIGS. 1(A)-(C) is that the same cross-sectional area and in-plane contour length for each island should be used, thus the electrical resistance among the different interconnects is kept consistent.

To analyze the stretchability of each interconnect geometry illustrated in FIGS. 2(A)-2(C), a finite element analysis was performed using commercially available finite element analysis software, ABAQUS, manufactured by Dassault Systemes of Velizy-Villacoublay, France. A buckling analysis is carried out in order to obtain the first ten buckling modes, which are then imported with random weight factors as imperfections. During the analysis, 20-node quadratic elements with reduced integration (C3D20R) are used and the mesh convergence is ensured. Next, a prescribed displacement force is applied to the rightmost end of each interconnect to stretch the interconnect while the leftmost end remains fixed. At a certain loading step, the prescribed displacement force is removed to ascertain whether the deformation is recoverable.

Figure 3A:
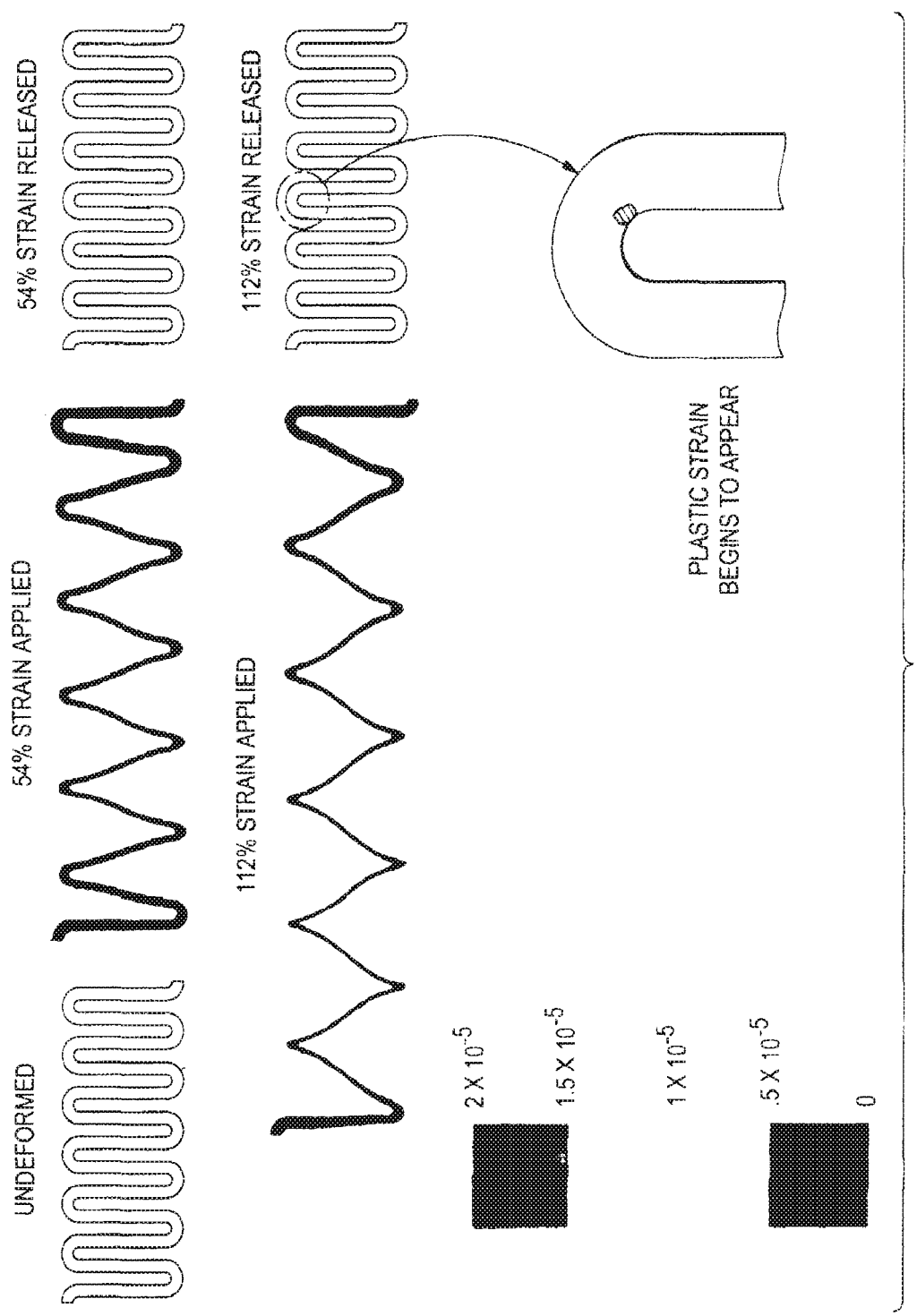
FIGS. 3(A)-(C) are top view drawings of deformed and undeformed states of the three interconnect structures illustrated in FIGS. 1(A)-(C)
Figure 3B:
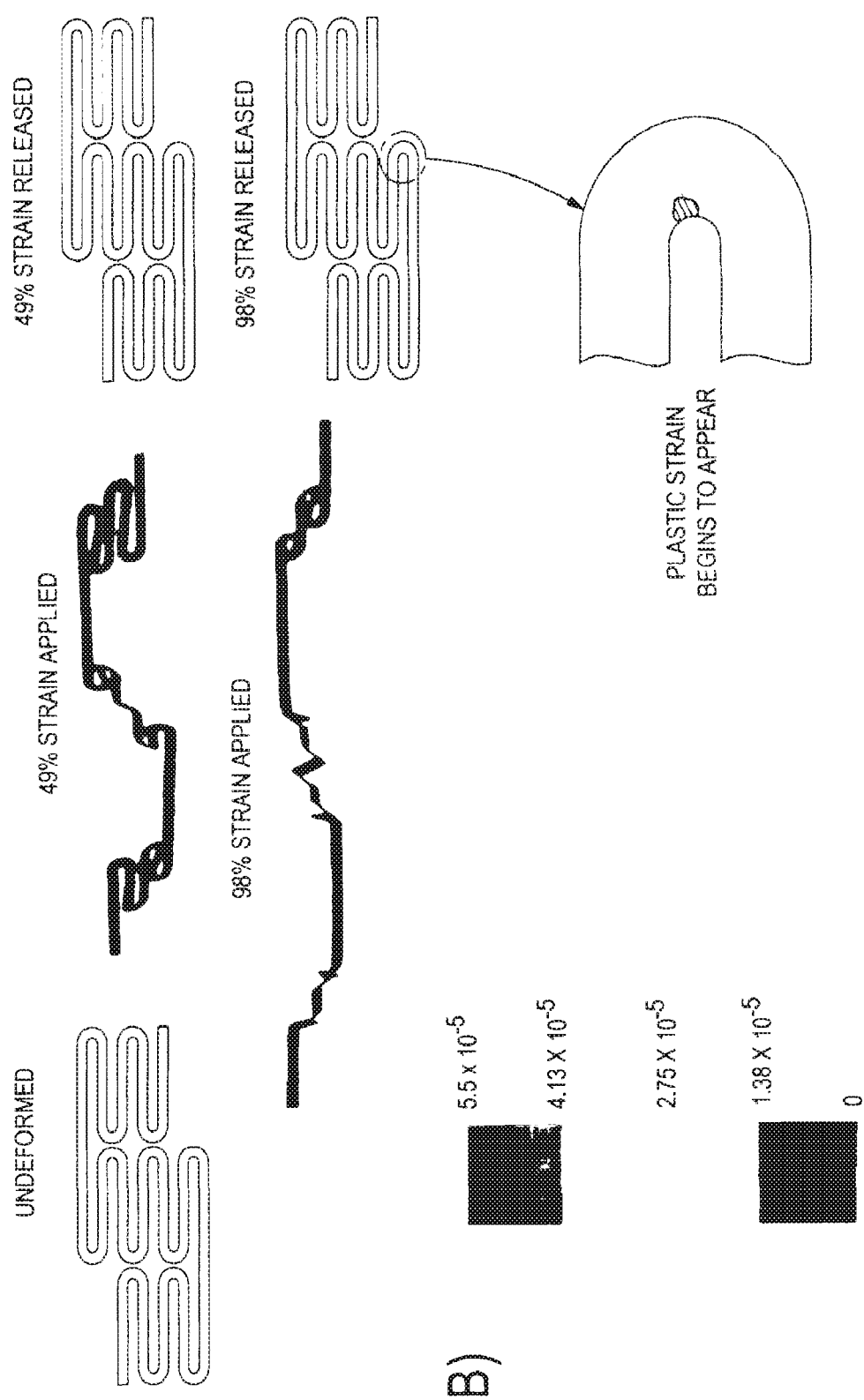
Figure 3C:
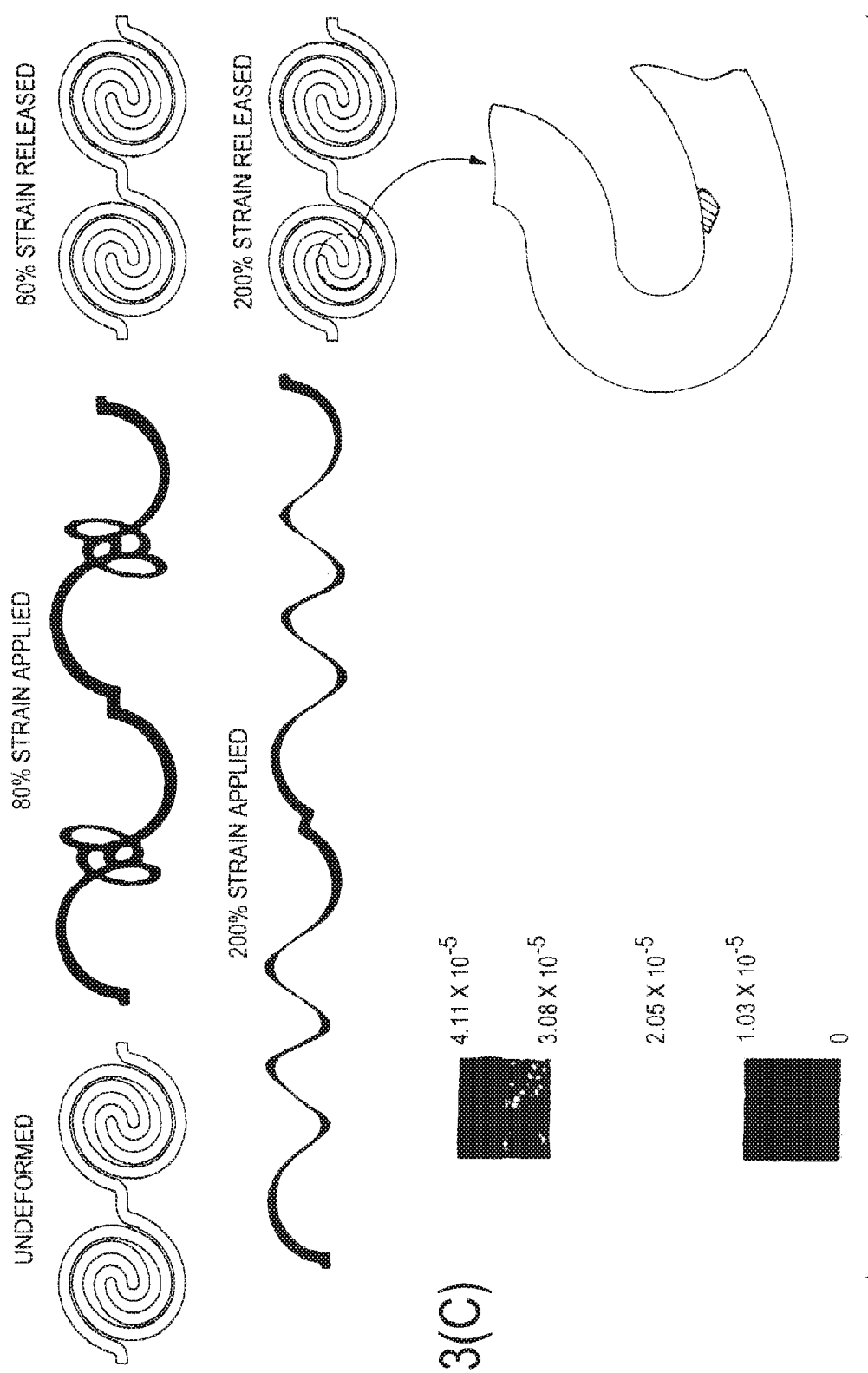

The results of the stretchability tests are illustrated in FIGS. 3(A)-(C). These figures show the elastic stretchability of each of the three patterns of FIGS. 2(A)-(C) under the constraints of the same in-plane span and contour length.

Here, elastic stretchability is defined as the critical strain at which the interconnect enters the plastic deformation zone, i.e., where the maximum equivalent strain exceeds the yield strain. The capability of restoration after the stretching force is removed was also analyzed. Thus, both the deformed state at the critical strain and the released state when the stretching force is removed are shown for each the three interconnect geometries, with the legend showing the equivalent plastic strain. To compare, the two states (deformed and released) of the interconnect at the halfway point of the critical strain are also provided, which is still within the elastic range and thus the deformation is fully recoverable.

As shown in FIGS. 3(A)-3(C), the results clearly show that the Archimedean spiral structure 100 has the largest elastic stretchability, up to 200%, while the regular serpentine and the self-similar serpentine have 112% and 98% elastic stretchability, respectively. The illustrations of the deformed states show that in-plane stretching is accompanied by out-of-plane deformation (mainly twisting and bending) for each interconnect. In other words, the out-of-plane deformation compensates the in-plane deformation. Particularly for the Archimedean spiral structure 100, the unfolding-like deformation occurs in order to compensate the in-plane stretching. From an application perspective, a low level out-of-plane deformation is desired in order to allow for denser stacking of the devices in the thickness direction. When the critical strain is released, the interconnect recovers almost to its undeformed shape, even when plastic deformation has already occurred. This is because, at the critical point or a little over the critical point, the regions that enter the plastic zone are very limited and the majority of the interconnect is still within the elastic domain. The plastic deformation is localized at the regions with large curvature.

Figure 4A:
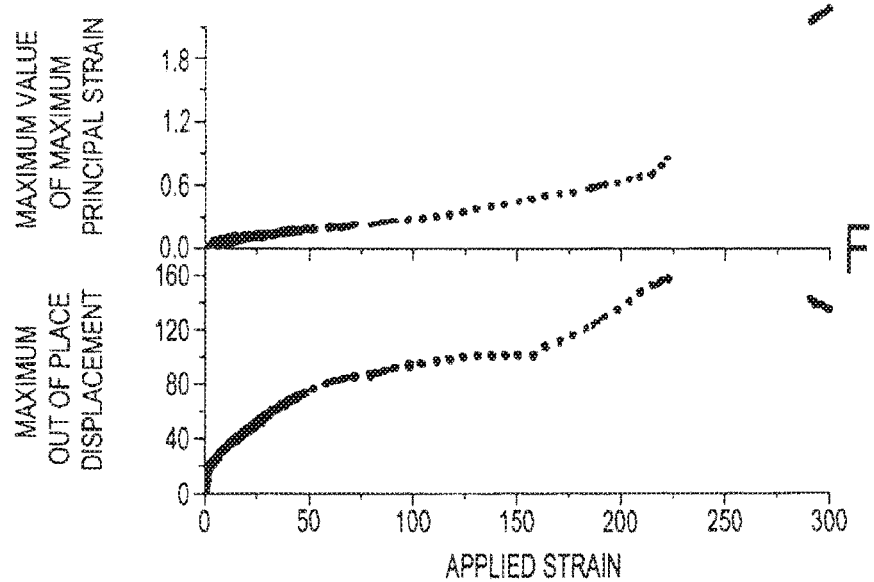
FIGS. 4(A)-(C) are graphs depicting the strain behavior of each of the three interconnect structures illustrated in FIGS. 2(A)-(C)
Figure 4B:
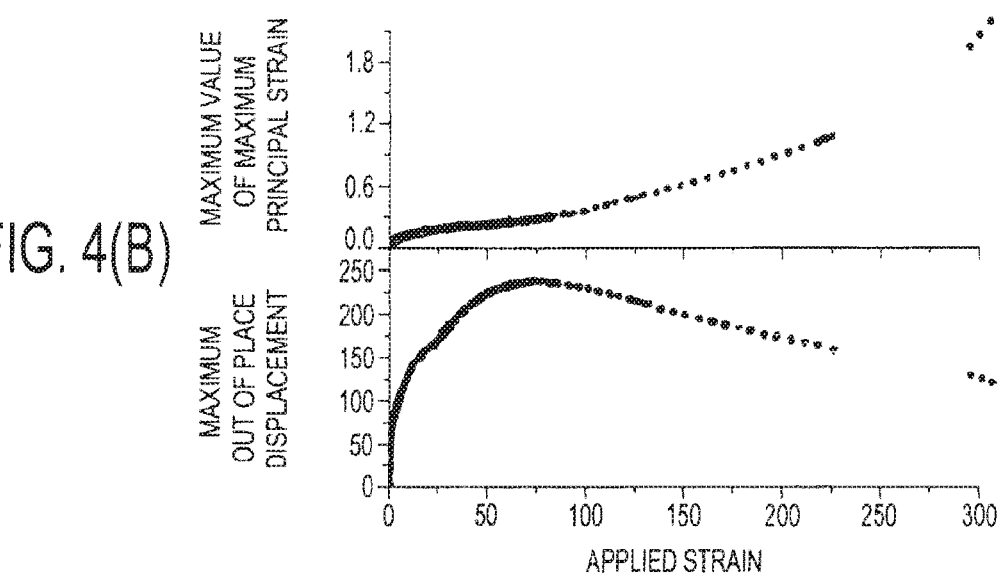
Figure 4C:
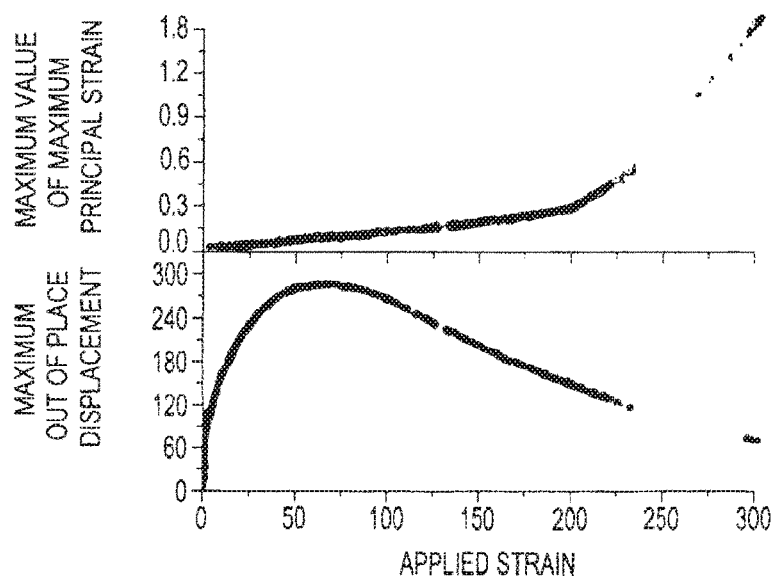

The strain behavior of each of the interconnect patterns tested above is provided in the graphs of FIGS. 4(A)-(C). Here, the stretchability of each interconnect is defined as the critical strain at which the maximum value of the maximum principal strain exceeds the fracture strain, 1%. FIGS. 4(A)-(C) also illustrate the out-of-plane deformation among these three interconnect patterns. The legend indicates the percentage of the materials with plastic deformation. Here, it is shown that the Archimedean spiral structure 100 still has the largest stretchability of up to 270%, while the other two serpentine structures have less stretchability at about 220%. The Archimedean spiral structure 100 had the highest level of out-of-plane deformation as the outer ring of the spiral rotated to compensate for the in-plane stretching, but the maximum out-of-plane deformation, 300 μm, is within the range of the thickness of an island or device, which will not affect the stacking density in the vertical direction. As the legend shows, the percentage of plastic deformation is rather small, on the order of 1%, which indicates that the spiral structure 100 has a good capability of restoring to its undeformed state even after entering the plastic deformation zone.

The comparisons set forth in FIGS. 3(A)-(C) and FIGS. 4(A)-(C) suggest that a uniform and small curvature to the interconnect pattern may contribute to a greater stretchability under the constraints of the same in-plane span and contour length. The regular and semi-similar serpentines (FIGS. 1(A) and 1(B), respectively) have zero curvature over their straight line segments, but large curvatures at the junctions between their straight lines. Because of design limitations for the serpentine-based structures, large curvatures are needed to have a large areal filling ratio. Thus, the curvature for the serpentine based structure transforms from zero curvature to large curvature along its length, which results in lower stretchability.

Figure 5:
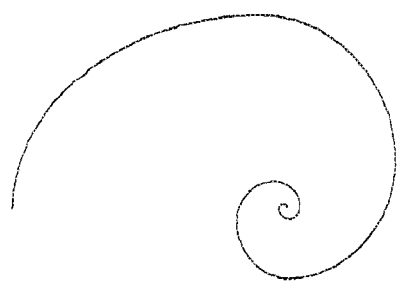
FIG. 5 is a top view drawing of a spiral interconnect structure according to an embodiment of the invention.

According to another embodiment, as illustrated in FIG. 5, a modified spiral structure 102 is used to form an interconnect, where the curvature evolves smoothly along the contour length such that it is elongated. In one embodiment, the modified spiral structure has a polar angle varying from 0 to $3\pi$.

Figure 6A:
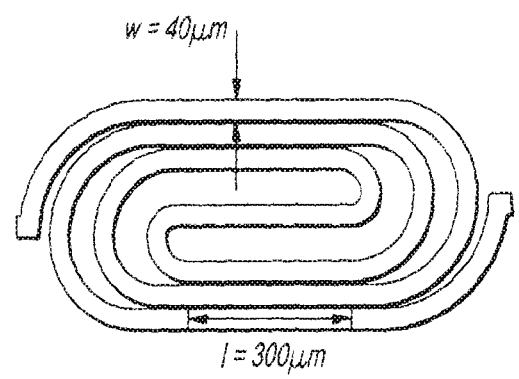
FIG. 6(A) is a top view drawing of a modified spiral interconnect structure according to an embodiment of the invention.

In another embodiment, two Archimedean spiral structures 100 are used to form an interconnect. To make the spiral-based structure more versatile so that it can better fit into a non-square area, a modified Archimedean spiral structure 100' may be used, as illustrated in FIG. 6(A). Here, the ratio between the horizontal and vertical dimensions is adjusted to fit into a non-square area. The approach is to modify the original Archimedean spiral structure 100 by multiplying with a smooth approximation to a step function of θ in polar coordinate system and then inserting straight lines to fit the in-plane area. As set forth in FIG. 6(A), the interconnect body width (w) is 40 microns, and the length (l) of each fold is 300 microns, but any particular dimensions suitable for use in a particular application may be used.

Figure 6B:
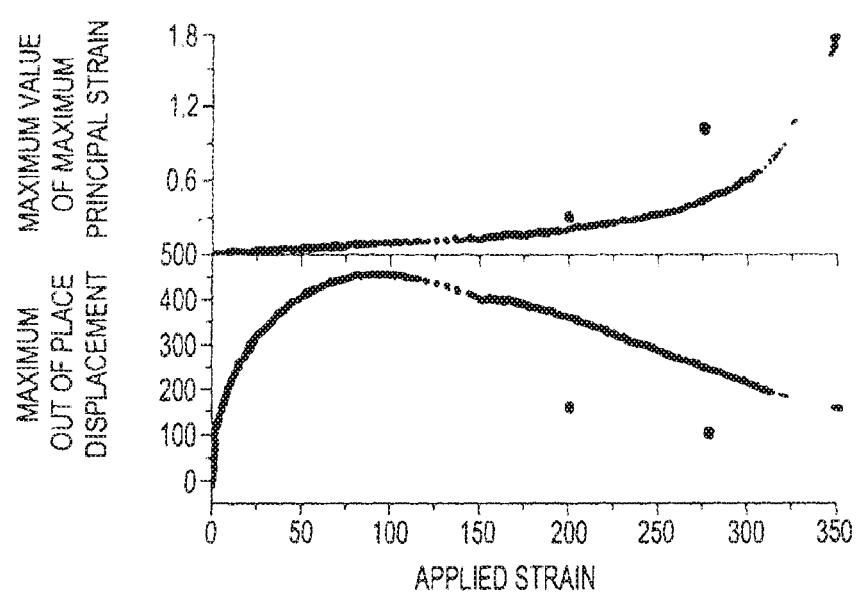
FIG. 6(B) is a graph depicting the strain behavior of the modified spiral interconnect structure of FIG. 6(A)

The stretchability of the modified Archimedean spiral structure 100' was analyzed by applying a prescribed displacement force at one end while the other end is fixed, as set forth herein. The results of this stretchability test are provided in FIG. 6(B). The same legend as that used in FIGS. 4(A)-(C) was used and the results for the original spiral structure 100 are marked on FIG. 6(B). Clearly, the graph shows that the modified Archimedean spiral structure 100' is even more stretchable than the original spiral structure 100, with over 250% elastic stretchability and 325% stretchability before fracture. The maximum out-of-plane displacement is about 450 which is an acceptable level. Without being bound by any particular theory, it is believed that the modified Archimedean spiral structure 100 is more stretchable because the newly added straight portions 104 allow the structure to more easily generate out-of-plane deformation without introducing large curvatures.

Figure 7A:
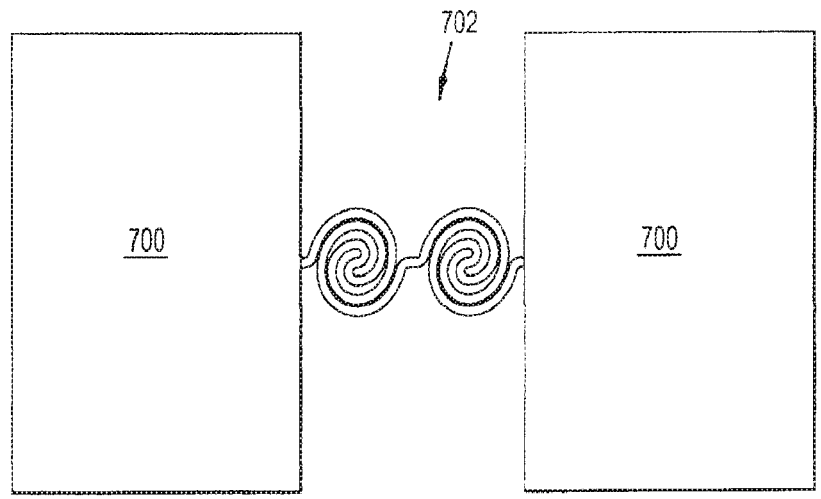
FIGS. 7(A)-(B) are top view drawings of an island-interconnect structure formed of the spiral interconnect of FIG. 1(C), according to an embodiment of the invention.
Figure 7B:
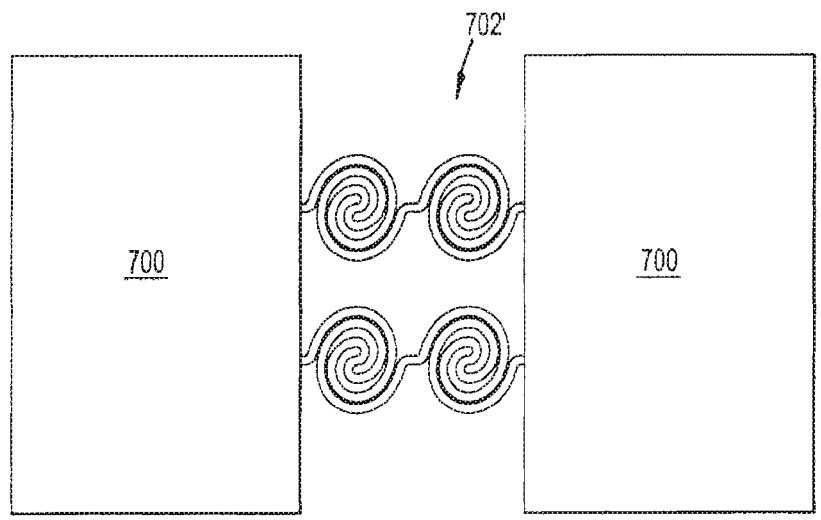

In one aspect, the spiral structure 100 is coupled to and positioned between opposing functional bodies 700 to form an island-interconnect structure 702, as illustrated in FIG. 7(A). In another embodiment illustrated in FIG. 7(B), two spiral structures 100 are used to form island-interconnect structure 702'. In an alternative embodiment, the island-interconnect structure 702 may be formed of a plurality of spiral structures 100, each coupled to opposing functional bodies 700. Each interconnect can thus be selectively movable between a fixed position, in which no relative movement between connected functional bodies 700 can be allowed, and a pliable position, in which relative movement between connected functional bodies 700 can be allowed.

Although several embodiments of the invention have been disclosed in the foregoing specification, it is understood by those skilled in the art that many modifications and other embodiments of the invention will come to mind to which the invention pertains, having the benefit of the teaching presented in the foregoing description and associated drawings. It is thus understood that the invention is not limited to the specific embodiments disclosed hereinabove, and that many modifications and other embodiments are intended to be included within the scope of the appended claims. Moreover, although specific terms are employed herein, as well as in the claims which follow, they are used only in a generic and descriptive sense, and not for the purposes of limiting the described invention, nor the claims which follow.

Various features and advantages of the invention are set forth in the following claims.

What is claimed is:

1. An electronic device comprising:
a first functional body;
a second functional body; and
at least one connection member connecting the first functional body to the second functional body, wherein the at least one connection member has a spiral pattern and is suspended in air to allow for stretching, flexing or compressing, and wherein the at least one connection member includes an elastic stretchability of greater than 120% when deformation is applied in-plane relative to a plane of the at least one connection member, wherein the first functional body includes a thickness, and wherein out-of-plane deformation of the at least one connection member caused by application of the deformation remains within the thickness of the first functional body.

2. The electronic device of claim 1, wherein the spiral pattern is an Archimedean spiral.

3. The electronic device of claim 2, wherein the Archimedean spiral is prescribed by a function $r=A \cdot \theta^q$, wherein r is the radius of the spiral pattern, $\theta=[0, 3\pi]$, A is a geometrical pre-factor, and q is a power that determines a shape of function.

4. The electronic device of claim 2, wherein the Archimedean spiral is prescribed by a function $r=\pm 60\theta^{1/1.7}$, wherein r is the radius of the spiral pattern and $\theta=[0, 3\pi]$.

5. The electronic device of claim 2, wherein the Archimedean spiral is elongated.

6. The electronic device of claim 1, wherein the at least one connection member is selectively movable between a fixed position and a pliable position, such that the first functional body is movable relative to the second functional body and vice versa.

7. The electronic device of claim 1, wherein the at least one connection member is a conductor.

8. The electronic device of claim 7, wherein the at least one connection member is formed of copper, chromium, aluminum, gold, silver, iron, cobalt, titanium, conductive nano fibers, ZnO, indium tin oxide (ITO), fluorine doped tin oxide (FTO), $ReO_3$, $IrO_2$, $CrO_2$, poly-para-xylylene, Parylene-C, polyimide, or polydimethylsiloxane.

9. The electronic device of claim 1, wherein the at least one connection member has a thickness of about one micron.

10. The electronic device of claim 1, wherein the electronic device is a battery.

11. The electronic device of claim 1, wherein the at least one connection member comprises at least two electrically connected connection members linked together in a series configuration, each connection member having a spiral pattern.

12. The electronic device of claim 11, wherein the at least two electrically connected connection members have an elastic stretchability of up to 250%.

13. The electronic device of claim 1, wherein the electronic device comprises a plurality of functional bodies, each functional body being connected by at least one connection member having a spiral pattern.

14. The electronic device of claim 1, wherein the at least one connection member comprises a plurality of layers.

15. The electronic device of claim 14, wherein at least one of the plurality of layers is a flexible layer.

16. The electronic device of claim 1, wherein the spiral pattern is non-periodic.

17. An electronic device comprising:
a first functional body;
a second functional body; and
at least one connection member connecting the first functional body to the second functional body, wherein the at least one connection member has an Archimedean spiral pattern and is suspended in air to allow for stretching, flexing or compressing, and wherein the at least one connection member includes an elastic stretchability of greater than 120% when deformation is applied in-plane relative to a plane of the at least one connection member,
wherein the Archimedean spiral includes an inner end, a first outer end, and a second outer end, and wherein the first outer end is connected to the first functional body, and the second outer end is connected to an adjacent Archimedean spiral.

18. The electronic device of claim 17, wherein the at least one connection member is a conductor.

19. The electronic device of claim 17, wherein the at least one connection member has a thickness of about one micron.

20. The electronic device of claim 17, wherein the at least one connection member comprises a plurality of layers.

* * * * *